US012693341B2

(12) United States Patent
Schmid et al.

(10) Patent No.: US 12,693,341 B2
(45) Date of Patent: Jul. 28, 2026

(54) METHOD FOR MONITORING AN ENERGY STORE IN A MOTOR VEHICLE

(71) Applicant: Robert Bosch GmbH, Stuttgart (DE)

(72) Inventors: Alexander Uwe Schmid, Budapest (HU); Christel Sarfert, Korntal-Muenchingen (DE); Martin Andreas Lohrmann, Bietigheim-Bissingen (DE); Philipp Schroeer, Althengstett (DE)

(73) Assignee: ROBERT BOSCH GMBH, Stuttgart (DE)

( * ) Notice: Subject to any disclaimer, the term of this patent is extended or adjusted under 35 U.S.C. 154(b) by 192 days.

(21) Appl. No.: 18/684,054

(22) PCT Filed: Sep. 27, 2022

(86) PCT No.: PCT/EP2022/076745
§ 371 (c)(1),
(2) Date: Feb. 15, 2024

(87) PCT Pub. No.: WO2023/066616
PCT Pub. Date: Apr. 27, 2023

(65) Prior Publication Data
US 2025/0028001 A1 Jan. 23, 2025

(30) Foreign Application Priority Data
Oct. 21, 2021 (DE) .................... 10 2021 211 873.9

(51) Int. Cl.
*G01R 31/3835* (2019.01)
*B60L 58/12* (2019.01)
(Continued)

(52) U.S. Cl.
CPC .......... *G01R 31/3835* (2019.01); *B60L 58/12* (2019.02); *G01R 31/371* (2019.01); *G01R 31/374* (2019.01); *G01R 31/389* (2019.01)

(58) Field of Classification Search
None
See application file for complete search history.

(56) References Cited

U.S. PATENT DOCUMENTS

| | | | |
|---|---|---|---|
| 2004/0032264 A1 | 2/2004 | Schoch | |
| 2004/0257087 A1* | 12/2004 | Murakami | ............ B60L 3/0046 |
| | | | 324/426 |
| 2012/0013180 A1* | 1/2012 | Muto | ....................... B60L 58/21 |
| | | | 307/9.1 |

FOREIGN PATENT DOCUMENTS

| | | |
|---|---|---|
| DE | 10203810 A1 | 1/2003 |
| DE | 102018201119 A1 | 7/2019 |

(Continued)

OTHER PUBLICATIONS

International Search Report for PCT/EP2022/076745, Issued Jan. 23, 2023.

(Continued)

*Primary Examiner* — Jas A Sanghera
(74) *Attorney, Agent, or Firm* — NORTON ROSE FULBRIGHT US LLP

(57) ABSTRACT

A method for monitoring an energy store in a motor vehicle, wherein the energy store supplies at least one, in particular safety-relevant, consumer, preferably for an automated driving function. In the method, at least one characteristic variable of the energy store is predicted. At least one measured variable of the energy store is recorded and at least one state variable of the energy store is ascertained as a function of at least the measured variable. The characteristic variable is predicted using a variable that has been stored in advance as a function of at least one state variable and that (Continued)

represents an influence of a loading history of the energy
store on the characteristic variable. The variable is selected
as a function of the state variable.

15 Claims, 9 Drawing Sheets

(51) Int. Cl.
     *G01R 31/371*        (2019.01)
     *G01R 31/374*        (2019.01)
     *G01R 31/389*        (2019.01)

(56)                    References Cited

FOREIGN PATENT DOCUMENTS

| | | | |
|---|---|---|---|
| DE | 102019219427 | A1 | 6/2021 |
| EP | 2019324 | A1 | 1/2009 |
| WO | 2020109108 | A1 | 6/2020 |

OTHER PUBLICATIONS

Fonseca et al., "A Novel State of Charge Dependent Equivalent
Circuit Model Parameter Offline Estimation for Lithium-Ion Bat-
teries in Grid Energy Storage Applications," 2020 IEEE Industry
Applications Society Annual Meeting, IEEE, 2020, pp. 1-8. <https://
sci-hub.ru/10.1109/ias44978.2020.9334862> Downloaded Feb. 7,
2024.

* cited by examiner

METHOD FOR MONITORING AN ENERGY STORE IN A MOTOR VEHICLE

FIELD

The present invention relates to a method for monitoring an energy store in a motor vehicle.

BACKGROUND INFORMATION

DE 10 2019 219 427 A1 relates to a method for monitoring an energy store in a motor vehicle, wherein the energy store supplies at least one, in particular safety-relevant, consumer, preferably for an automated driving functions, wherein at least one performance capability of the energy store is ascertained by predicting at least one characteristic variable of the energy store as a function of a load curve, wherein it is ascertained whether the energy store has been exchanged, and, after a detected exchange of the energy store, it is ascertained whether the exchanged energy store is an allowable energy store.

An object of the present invention is to further increase the safety and reliability of an on-board power system. The object may be achieved by features of the present invention.

SUMMARY

According to the present invention, in that the characteristic variable is predicted using a variable that has been stored in advance as a function of at least one state variable and that represents an influence of a loading history of the energy store on the characteristic variable, even dynamic load situations, which also mean different loads for the energy store depending on the driving pattern, can be deliberately taken into account in a simple manner. Thus, not only the equilibrium state or static operating point of the energy store is taken into account, but the operating history is in particular also included. The prediction can thus be carried out in a considerably more accurate manner. For safety-relevant applications in particular, for example in autonomous driving, it is particularly important that the quality of the energy store is reliably monitored, which must reliably supply safety-relevant consumers. The variable is stored as a function of particular measured variables or state variables so that the relevant loading history is later used as the basis for the prediction, taking into account the actual ambient conditions. As a result, different types of energy stores at different ambient conditions can also be stored so that suitable parameters can also be used in the prediction.

In an expedient development of the present invention, the energy store is loaded with a load profile, in particular comprising at least one base load and one peak load, and, after a rest phase, in particular until an open-circuit voltage of the energy store has been reached, is loaded with a further load profile, in particular a peak load, and the arising voltage curve is evaluated in order to ascertain the variable. Thus, on the one hand, safety-relevant boundary situations can be simulated and, on the other hand, the loading history can, for example, also be represented in a simple manner via the relaxation behavior or the corresponding voltage difference. These measurements can be carried out offline for various types of energy stores prior to the actual use in ongoing driving operation.

In an expedient development of the present invention, the arising voltage curve is evaluated in order to ascertain a time constant with which the voltage increases again in the rest phase, and/or in particular in order to ascertain a voltage level to which the voltage increases again at the start of the loading with the further load profile, and/or in order to ascertain a dynamic voltage. The evaluation using only the voltage curve and the later use in ongoing operation of the vehicle are thus simplified.

In an expedient development of the present invention, the voltage curve and/or the variable, in particular a dynamic voltage, is ascertained as a function of at least one state variable, in particular ascertained again in the case of a changed state variable. Thus, different operating situations can be covered in advance, which can be retrieved later in the ongoing operation of the vehicle. This further increases the quality of the prediction.

In an expedient development of the present invention, a time constant, in particular a relaxation time, which represents a relaxation behavior of the energy store, is used as a variable that represents an influence of a loading history of the energy store on the characteristic variable. Particularly preferably, the time constant is ascertained as a function of the temperature and/or is stored in an assignment table. Relevant influencing variables are thus represented in a simple manner in advance, which can be retrieved again in ongoing operation. Particularly expediently, a relaxation behavior of the energy store is represented by a state variable in the form of the charge, wherein the time constant is used to ascertain the state variable. This further improves the quality of the prediction.

In an expedient development of the present invention, the characteristic variable is predicted as a function of a ratio of the internal resistance and the polarization resistance. The corresponding resistance ratio also ensures that the aging behavior of the energy store is taken into account in a simple manner and that the prediction is also on the safe side. The ratio is stored as a function of particular measured variables or state variables so that the relevant resistance ratio is later used as the basis for the prediction, taking into account the actual ambient conditions. As a result, different types of energy stores at different ambient conditions can also be stored so that suitable parameters can also be used in the prediction.

Further expedient developments of the present invention arise from the disclosure herein.

DETAILED DESCRIPTION OF EXAMPLE EMBODIMENTS

The present invention is schematically shown in the figures on the basis of embodiments and is described in detail below with reference to the figures.

In the exemplary embodiment of the present invention, a battery or accumulator is described as a possible energy store by way of example. However, alternatively, other energy stores, for example on an inductive or capacitive basis, fuel cells, capacitors, or the like, suitable for this task can likewise be used.

Figure 1:
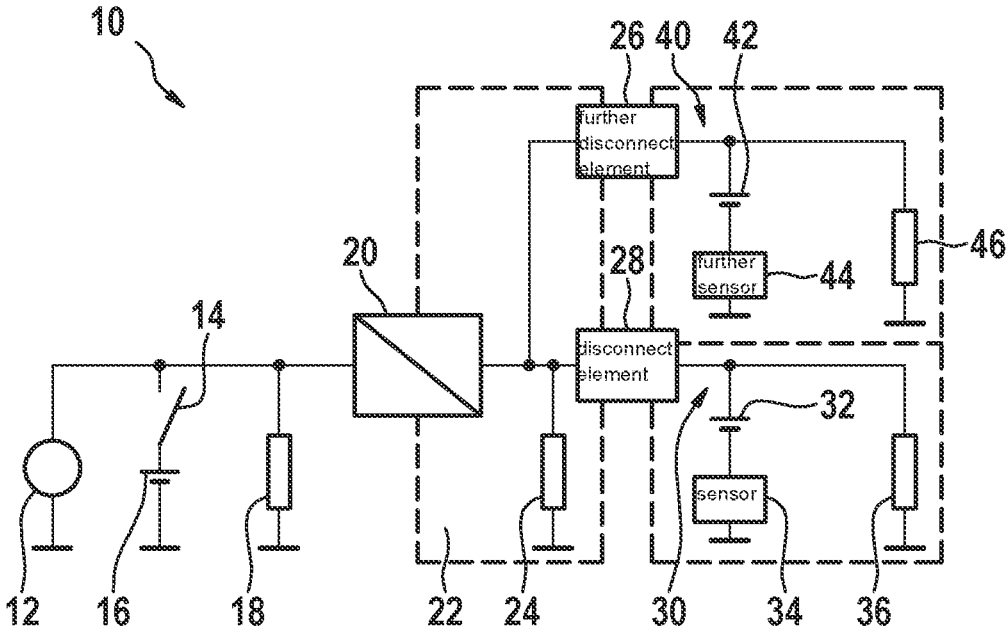
FIG. 1 shows a possible on-board power system for a vehicle with a safety-relevant consumer, according to an example embodiment of the present invention.

FIG. 1 shows a possible topology of an energy supply system, consisting of a basic on-board power system 22, which supplies at least one basic consumer 24, which is shown by way of example. Alternatively, an energy store or a battery with an associated (battery) sensor and/or a starter, and/or several non-safety-relevant comfort consumers, which could be protected or actuated by an electrical load distribution, could also be provided in the basic on-board power system 22. The basic on-board power system 22 has a lower voltage level than a high-voltage on-board power system 10; it may, for example, be a 14 V on-board power system. A DC voltage transformer 20 is arranged between the basic on-board power system 22 and the high-voltage on-board power system 10. The high-voltage on-board power system 10 comprises, by way of example, a high-voltage energy store 16, such as a high-voltage battery, possibly with an integrated battery management system, a non-safety-relevant load 18 or comfort consumer shown by way of example, such as an air-conditioning system, etc., supplied at an increased voltage level, as well as an electric machine 12. For supplying the high-voltage on-board power system 10, the energy store 16 can be connected via a switching means 14. In this context, a voltage level that is higher than the voltage level of the basic on-board power system 22 is understood to be high-voltage. It could be a 48 volts on-board power system, for example. Alternatively, especially in vehicles with an electric drive, it could be even higher voltage levels. Alternatively, the high-voltage on-board power system 10 could be eliminated entirely, wherein components such as the starter, generator and energy store are then assigned to the basic on-board power system 22.

For example, two safety-relevant channels 30, 40 are connected to the basic on-board power system 22. The first safety-relevant channel 30 is connected to the basic on-board power system 22 via a disconnect element 28. The further, safety-relevant channel 40 is connected to the basic on-board power system 22 via a further disconnect element 26. The first safety-relevant channel 30 can be supplied with energy via an energy store 32. The characteristic variables of the energy store 32 are sensed by a sensor 34. The sensor 34 is preferably arranged adjacent to the energy store 32. The first safety-relevant channel 30 supplies a safety-relevant consumer 36. This safety-relevant consumer 36 is only shown by way of example. Further, safety-relevant consumers 36 are supplied via the safety-relevant channel 30 as needed.

The further, safety-relevant channel 40 can also be supplied by a further energy store 42. The characteristic variables of the further energy store 42 are sensed by a further sensor 44. The further sensor 44 is arranged adjacent to the further energy store 42. The further, safety-relevant channel 40 supplies at least one further, safety-relevant consumer 46. Further, safety-relevant consumers 46 can also be supplied in the further, safety-relevant channel 40 as needed.

The topology shown in FIG. 1 is merely chosen, by way of example, as one of many exemplary embodiments. There are a variety of ways in which the safety-relevant channels 30, 40 are mounted. By way of example, it would be possible for the further, safety-relevant channel 40 to be attached to the safety-relevant channel 30 or to channel 10 via a further DC voltage transformer.

The disconnect element 26, 28 serves to protect the respective safety-relevant channels 30, 40 so that any faults occurring in the basic on-board power system 22 and/or in a safety-relevant channel 30, 40 cannot affect the other safety-relevant channel 30, 40. This can be corresponding switching means or DC voltage transformers via which a disconnection or connection of the subsystems becomes possible. Alternatively, the disconnect elements 26, 28 could be eliminated entirely so that the channels 30, 40 are connected directly to the DC voltage transformer 20.

The redundant, in particular functionally redundant, safety-relevant consumers 36, 46, which can be supplied via the two safety-relevant channels 30, 40 are those that are necessary to transition a vehicle from an automated driving operation (no driver intervention necessary) to a safe state, for example in the event of critical faults. This can be a stopping of the vehicle, whether it is immediate, on the roadside or not until the nearest rest area, etc.

Nevertheless, the functional capability of the energy store 16, 32, 42 to supply the safety-relevant consumer(s) 36 also plays an important role in the event of a possible fault. With the introduction of the electric steering and brake as well as the progressive automation of the vehicle, it is increasingly important to ensure a safe electrical supply for these safety-relevant components or consumers 36, 46. Since the energy store 16, 32, 42 plays a key role therein, the functions that now have to determine the performance capability of the energy store 16, 32, 42 must be developed according to particularly high requirements, such as those laid down in ISO 26262. This also has far-reaching consequences on the development of functions and algorithms, as well as on the hardware on which these functions are used. The method explained below enables a reliable prediction of a characteristic variable, such as the voltage Up of the energy store 16, 32, 42 in accordance with ISO 26262. The prediction of the characteristic variable Up of the energy store 16, 32, 42 is an important component for an on-board power system 30, 40 that is safe in accordance with safety standards.

In the prediction of the performance capability in the context of safely supplying safety-relevant consumers 36, 46 until the vehicle is in a safe state (the vehicle stands safely on the roadside, parking bay, etc.), it must be ensured that the energy store 16, 32, 42 can operate at least one or more safety-relevant consumers 36, 46, such as results from a combined steering and braking process. The load estimation for the safety-relevant consumers 36, 46 is expressed by a so-called state-of-function (SOF) (current) profile. By way of example, such a load profile 50 is, for example, shown in FIG. 2 in the form of the necessary current I required from the energy store 16, 32, 42 for this purpose. The respective load profile 50 can in this case define a maximum requirement for the energy store 16, 32, 42, during the execution of which the characteristic variable Up then cannot fall below a particular limit value Ulimit.

One specific of the approach in the safety context is that one cannot assume to know which energy store 16, 32, 42 is ultimately used. For example, in an unmonitored exchange of the energy store 16, 32, 42, the situation can arise that an energy store 16, 32, 42 that has not been measured in advance and whose characteristic is not known is used. A further, important part of the solution is therefore to generate parameter sets 78, 80 that cover a multitude of energy stores 16, 32, 42 without missing the safety target.

The measurement concept for determining the parameter sets 78, 80 is generically designed so that a great many different SOF profiles (customer requests) can be created by a corresponding parameterization. An envelope 52 around the load profile 50 provides a generalized approach by means of which flexible customer solutions (such as the current profile in FIGS. 3A, 3B, 3C) are realized.

Since the solution space can be very large, a multitude of parameter values 78, 80 must be stored. Since the computing and memory resources in the vehicle are generally very limited, in particular for components such as the sensor 34, 44, in particular the battery sensor that must, for example, fit into the pole recess of the battery, it may happen that this is no longer possible for reasons of memory. The regression was therefore carried out in such a way that the necessary amount of memory was kept as low as possible. A look-up table or assignment table 72 can be used as a possible solution. An alternative approach reduces the amount of memory even further via the representation of the look-up table or assignment table 72 via a function, such as a polynomial function 76.

In an accumulator as a possible energy store 16, 32, 42, the prediction-relevant variable in the energy store 16, 32, 42 as to whether the latter is able to provide the required performance, is not only the internal resistance Ri but also the polarization resistance Rpol. Due to its multifactorial dependence (time t, current level I, temperature T, state of charge SOC of the energy store, aging type and aging progress, model and type of the energy store, preload), the polarization resistance Rpol is a complex variable and difficult to determine.

For the function or the algorithm, this means in the safety-relevant context that the algorithm must detect multifactorial relationships for all possible operating scenarios and must weight them accordingly. In doing so, a safe prediction of the relevant characteristic variable Up of the energy store 16, 32, 42 must always be made. For example, the aging of the energy store 16, 32, 42 must be taken into account.

What can be ascertained very well in the safety context is the ohmic internal resistance Ri of the energy store 16, 32, 42 or of the battery. This changes with the aging of the accumulator and is thus an indicator of aging, although not the only one. Nonetheless, the change in the value of the internal resistance Ri can be used to make a safe prediction of the existing or no longer existing performance capability of the energy store 16, 32, 42 even over the service life of the energy store 16, 32, 42.

Figure 7:
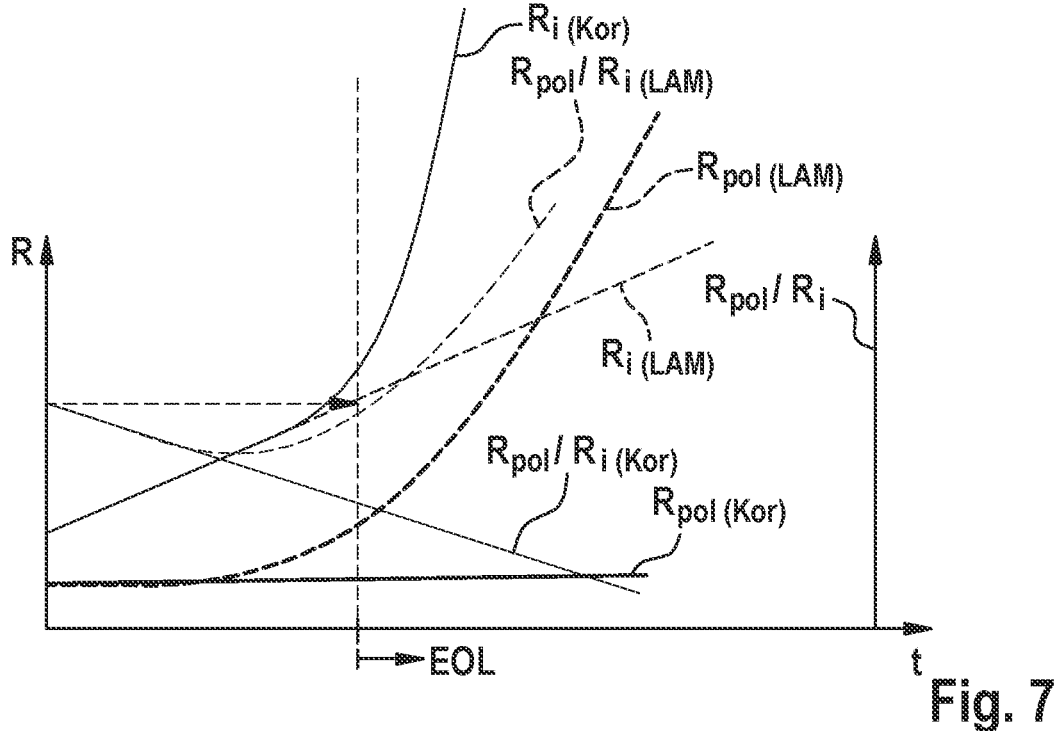
FIG. 7 shows time-dependent curves of particular characteristic variables of the energy store.

The solution is based on the fact that the ratio of the internal resistance Ri to the polarization resistance Rpol, which ratio can be determined very well for an energy store 16, 32, 42 at the begin of life, changes in a characteristic manner over the course of aging. In particular, it can be assumed that the increase in the internal resistance Ri due to aging is always equal to or even greater than the increase in the polarization resistance Rpol due to aging (FIG. 7). If the ratio of these two variables Ri, Rpol is formed and this ratio is maintained even if the energy store 16, 32, 42 ages, the prediction is on the safe side under safety aspects, for example in accordance with the ISO 26262 standard.

Figure 2:
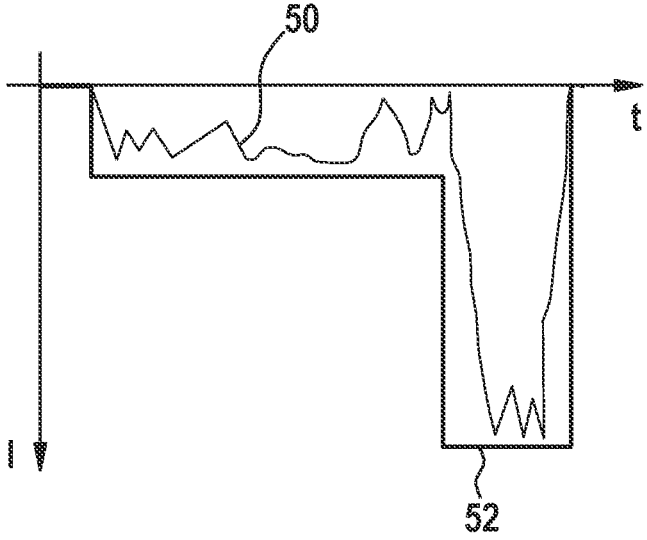
FIG. 2 shows a simplified load profile.

By way of example, FIG. 2 shows a time curve of a load profile 50. This load profile 50 by way of example represents possible typical load curves of the safety-relevant consumers 36, 46 as demanded, for example, as a minimum requirement for typical situations, for example for carrying out a stop on the side strip or similar driving maneuvers to still be carried out in any case, in particular in the event of a fault. The temporally, optionally highly, fluctuating curves of the load profile 50 are approximated via an envelope 52. The approximation takes place with a view to ensuring the function in such a way that, in case of doubt, higher loads on the energy store 16, 32, 42 would be demanded in the use of the envelope 52 for the prediction based thereon. In the exemplary embodiment, a current I to be provided by the energy store 16, 32, 42 is used as the load profile 50.

Figure 3A:
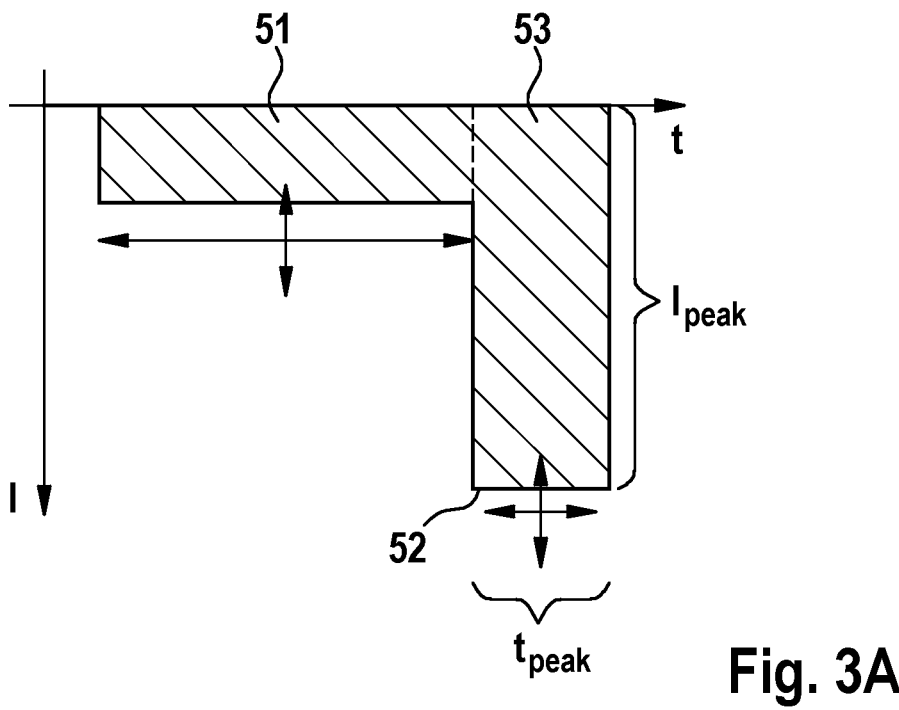
FIGS. 3A to 3C show various further, simplified load profiles.
Figure 3B:
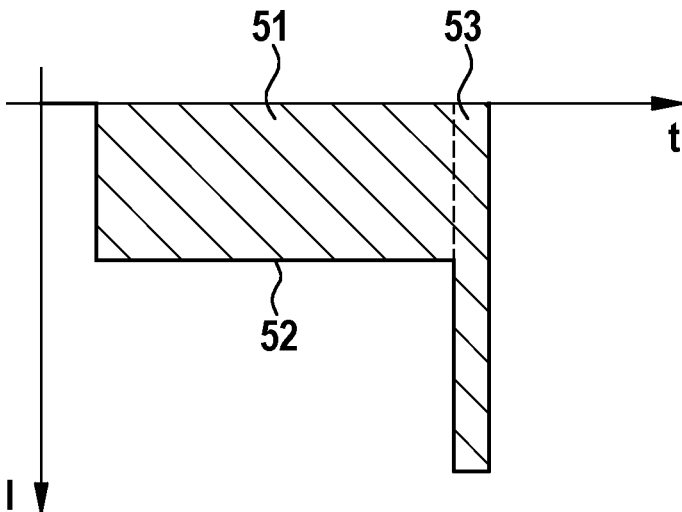
Figure 3C:
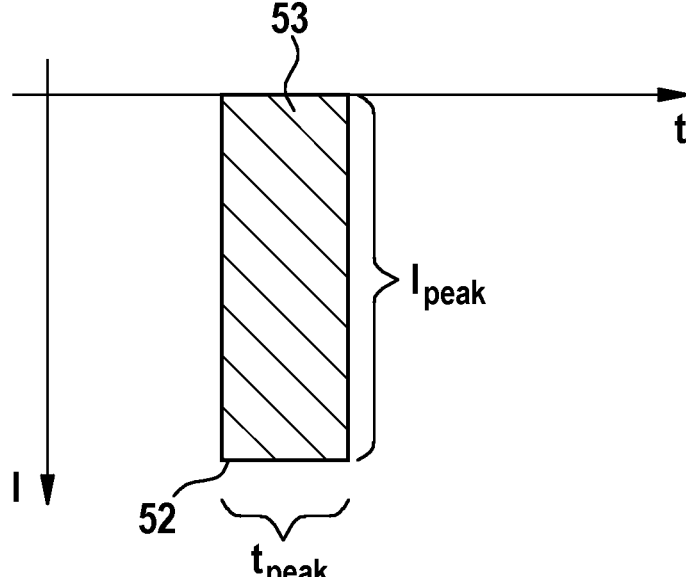

For the prediction of the performance or of a characteristic variable Up of the energy store 16, 32, 42 or of a battery (so-called state-of-function SOF), a single- or two-stage load profile 50, for example a current profile, is defined with defined lengths of time, which is used to form an envelope 52 around the estimated load profile 50 in the event of a safety situation. The load profile 50 or the associated envelope 52 can be changed in the amount, in particular the amount of current, and in the time duration depending on the customer request. The solution is flexible for different current profiles (FIGS. 3A to 3C). The load profile 50 can be flexibly adjusted depending on the customer request. However, there are particular maximum limits that depend on the capacity of the energy store 16, 32, 42, in particular the battery capacity. For example, maximum limits could be defined in a particular time span (tpeak, for example up to 15 seconds) for a particular peak load 53 (Ipeak, for example at most five times the battery capacity C per hour, for example 300 A) and, for example, in the order of magnitude of 60 seconds for the base load 51 (for example at most twice the battery capacity C per hour, for example 120 A). These exemplary values can be seen in FIG. 3.

Figure 4:
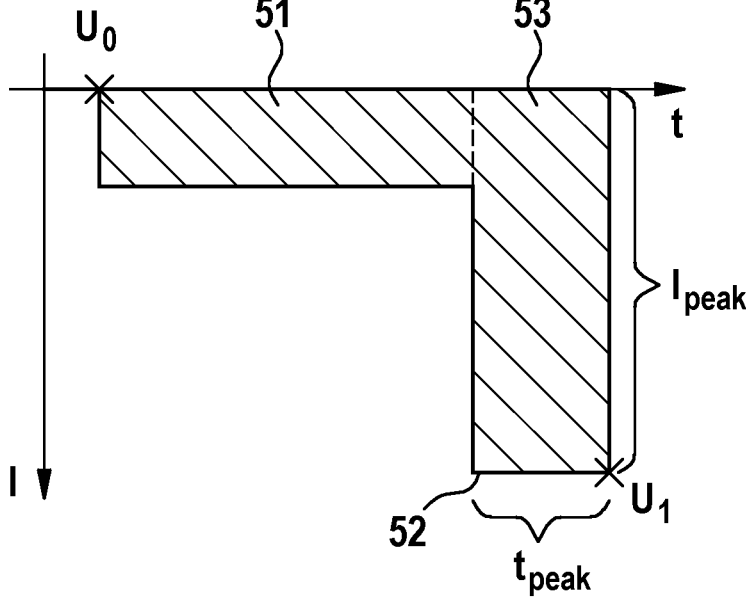
FIG. 4 shows a load profile and the associated predicted characteristic variable of an energy store, according to an example embodiment of the present invention.
Figure 4:
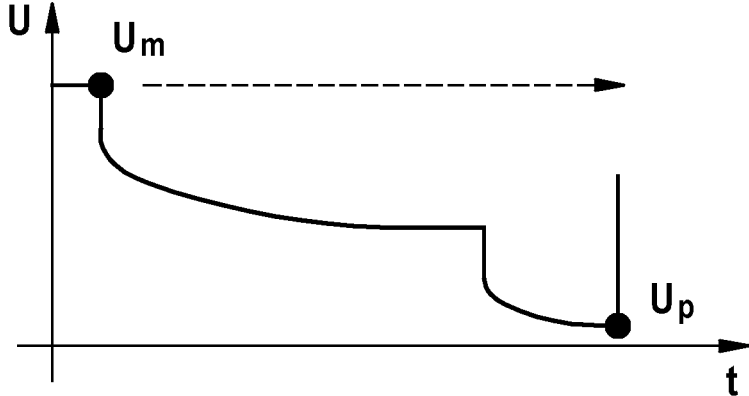

This defined load profile 50 or the associated envelope 52, which is coordinated with the customer, is used for the performance forecast or prediction of the characteristic variable such as the voltage Up (on-board power system voltage, voltage at the energy store 16, 32, 42), as shown in FIG. 4. The load profile 52 possibly comprises a base load 51 and a peak load 53. The peak load 53 is defined by the maximum load, such as the maximum current Ipeak, which is applied for a duration tpeak that is generally shorter in comparison to the base load 51. The base load 51 is generally characterized by a longer load curve with a lower load. Optionally, other variables such as temperature T or current I are measured at the energy store 16, 32, 42, for example by the respective sensor 34, 44. For the prediction of the probably arising characteristic variable Up, such as the voltage prediction, the defined load profile 50 or associated envelope 52 is used as the load basis, as explained in more detail in the following FIGS. 5 and 6.

Figure 5:
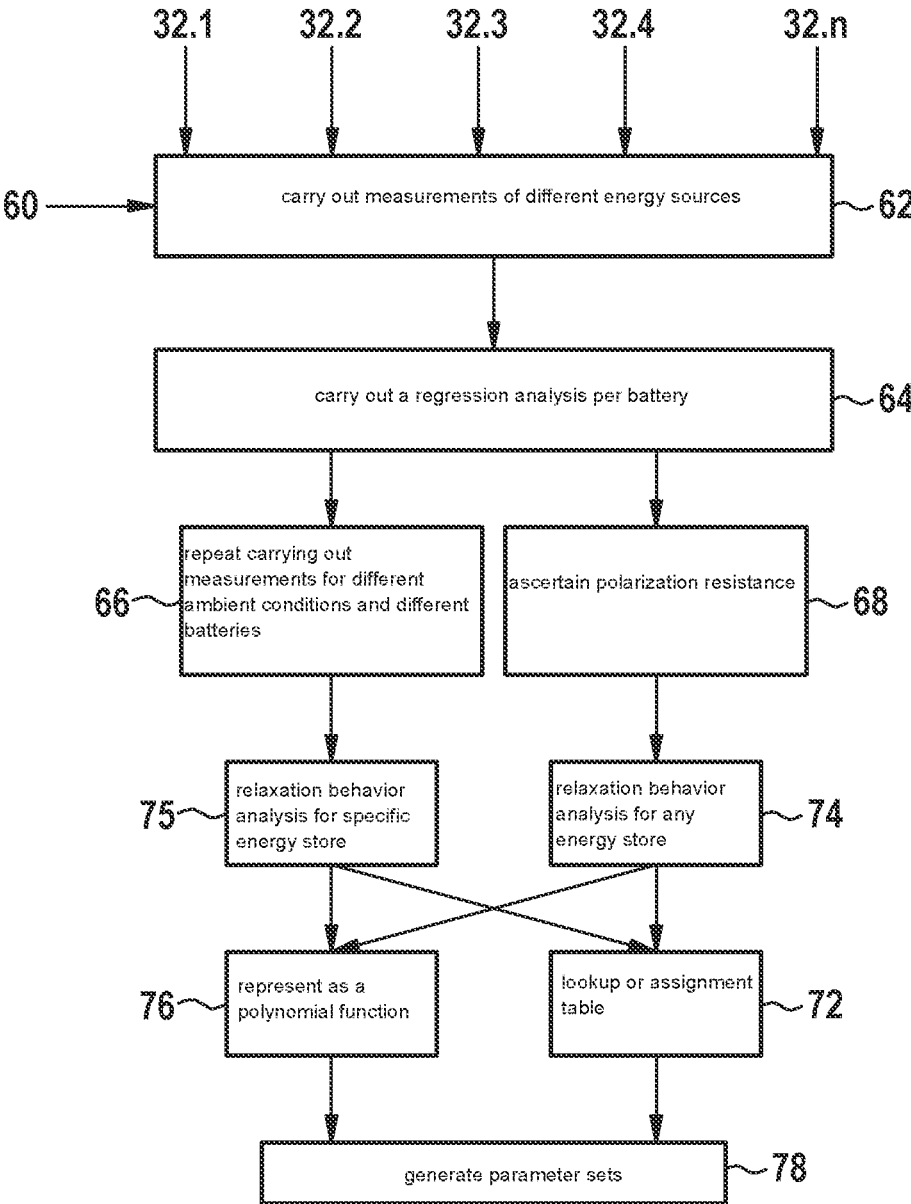
FIG. 5 shows a block diagram for ascertaining the parameters for a static model, according to an example embodiment of the present invention.

In the exemplary embodiment according to FIG. 5, measurements of different energy stores 32.1, 32.2 . . . 32.$n$ are carried out in a block 62. For this purpose, generic measurement specifications 60 are used, which are available to the measurement block 62. These measurements for different energy stores take place offline, i.e., prior to starting the method, for example in the sensor 34, 44, preferably outside the vehicle. The customer-specific load profiles 50 as described by way of example in connection with FIGS. 2 and 3 are used as the basis for the measurements. Essentially, current and voltage values that arise at the beginning and/or at the end of a flank change in a load profile 50 are recorded. For a lead-acid battery as a possible energy store 16, 32, 42, a particular voltage U0, also called OCV open-circuit voltage, arises at the beginning without a load on the energy store 16, 32, 42. When the current profile or the current flank is applied, the voltage response at the beginning is an immediate, time-independent voltage drop in the amount of Ri*I (voltage drop due to the internal resistance Ri). The subsequent further voltage drop Upol (after a practically immediate voltage drop in the amount of Ri*I) depends heavily on the time duration t of the load profile 50 until, after a particular time constant, the further voltage drop Upol in the amount of the polarization voltage Upol arises. The voltage value (Up=U0–I*Ri–Upol) that probably arises in this load profile (I) should be greater than the minimum allowable voltage Ulimit so that the energy store 16, 32, 42 still ensures safe operation.

The measurements according to block 62 are repeated for each energy store 32.1, 32.2, 32.3, 32.4 . . . 32.n. The corresponding load profiles 50 or the associated envelopes 52 are in this case used as the basis, as described in connection with FIGS. 2-4.

As a result, the present invention offers the possibility that the model 86 is adjusted (FIG. 6) either toward a customer-specific solution (cf. block 75 in FIG. 5) with corresponding parameter sets of an underlying specific battery or in a generalized manner (cf. block 74 in FIG. 5) for any number of selected batteries. The basis in this respect is the recording of battery measurement data using a generic measurement specification 60. By using these (battery) measurements, the individual influencing factors of the voltage behavior can be analyzed per battery. The parameterization inter alia includes the dependence of the polarization voltage Upol on the internal resistance Ri of the energy store 16, 32, 42 or the battery. These relationships are approximated and used in the form of analytical functions. The parameterization of the model 86 is carried out for a particular load profile 50 or envelope 52.

From these measured values U, I or known load profile 50, a regression analysis is carried out per battery, block 64. The measurements for ascertaining the internal resistance Ri in block 66 are now repeated for different ambient conditions and different energy stores 16, 32, 42. The ambient conditions can be varied. This can, for example, be the open-circuit voltage U0 and/or the temperature T of the energy store 16, 32, 42. However, other influencing variables or associated influencing variables, such as the state of charge SOC, or the like, can alternatively also be used. In the exemplary embodiment, a 2-dimensional Ri field for each measured energy store type is thus spanned as a function of the open-circuit voltage U0 and the temperature T (Ri (U0, T)). As described, the load profile 50 or the associated envelope 52, which can be specified individually by the customer and can represent the worst case scenario, can be used as a suggestion for the measurement.

In block 68, the polarization resistance Rpol is ascertained, again as a function of particular ambient conditions. In the exemplary embodiment, the current I and the temperature T are used as the ambient conditions and are deliberately varied for each energy store type, and the polarization resistance Rpol is ascertained under changed conditions. The open-circuit voltage U0 could also be used as a further ambient condition. In principle, the polarization resistance Rpol is ascertained using the following equation:

$$R_{pol}(t) = \frac{\Delta U_{tot}}{\Delta I_{tot}} - R_i = \frac{U_1 - U_0}{I_1 - I_0} - R_i$$

where U0 is the open-circuit voltage, U1 is the voltage value arising at the end of the load profile 50, 10 is the current used at the beginning of the load profile 50 and I1 is the current used at the end of the load profile 50, and Ri is the internal resistance.

Thus, the polarization resistance Rpol for each energy store type is recorded with the changed load profile 52, or current profile, and changed temperature profile T. In the exemplary embodiment, a 3-dimensional Rpol field for each measured energy store type is thus spanned as a function of the current I, the respective maximum current Ipeak for the respective load profile 52, temperature T and the open-circuit voltage U0 (Rpol (I, T, U0)).

The output variables of blocks 66, 68 are passed (via blocks 74 and/or 75 as briefly mentioned above) to a block 72, in which the ratio of the polarization resistance Rpol to the internal resistance Ri (Rpol/Ri) is in particular formed in the form of an assignment table. The ratio Rpol/Ri is formed as a function of the battery temperature T and as a function of the open-circuit voltage U0 and is stored in the form of the assignment table. For each battery type, the corresponding ratios Rpol/Ri are ascertained for respectively identical open-circuit voltages U0 or identical temperatures T of the individual values Rpol (U0, T) and Ri (U0, T). The function can be adjusted either toward a specific battery solution 32.1 or 32.2 or 32.3 etc. (block 67) or toward an entire group of batteries or energy stores 16, 32, 42 (block 69). Preferably, at block 69, the maximum value Rpol/Ri per battery group 16, 32, 42 in the sense of a safe design is selected for each operating point. For example, these (maximum) ratios Rpol/Ri can be stored depending on any number of open-circuit voltage values U0 (for example, between 11.5 and 13 V) and temperature values T (for example, between –20° C. and 70° C.) and can be retrieved as value pairs from the assignment table 72.

Alternatively, the worst-case value pairs could be represented via an analytical function, such as a polynomial function or other suitable functions. This can further reduce the memory consumption for storing the model behavior. This takes place in block 76.

The value pairs (Rpol/Ri) are thus available as parameters 78 according to block 76 as a function f=(T,U0), dependent on the temperature T and/or the open-circuit voltage U0, whether in the form of the assignment table 72, whether in the form of a generalization via a function or polynomial. The offline parametrization is thus completed. The parameters 78 are now available for further use in the ongoing operation of the vehicle, as described in FIG. 6 below.

Figure 6:
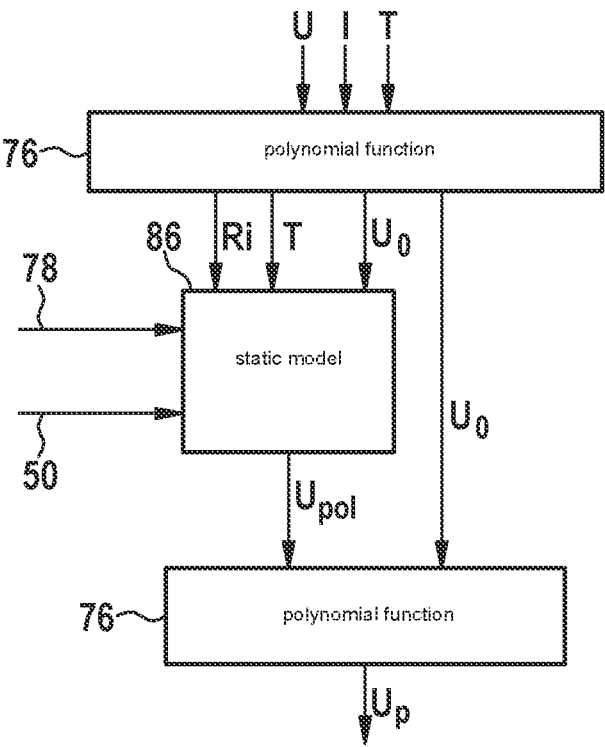
FIG. 6 shows a block diagram for ascertaining a predicted characteristic variable of the energy store on the basis of the static model, according to an example embodiment of the present invention.

FIG. 6 describes the evaluation of the current state of the energy store 16, 32, 42 in the ongoing operation of the vehicle. The evaluation could be realized in the sensor 34, 44, for example. Alternatively, this could also take place in a further control unit in the vehicle or else externally to the vehicle, for example in a cloud.

According to FIG. 6, various measurement data, such as the voltage U, current I, temperature T, as sensed by the sensor 34, 44, are passed to a state detection 82 for the energy store 16, 32, 42. The state detection 82 could be realized in the sensor 34, 44 or else, alternatively, also in a further control unit in the vehicle or externally to the vehicle, for example in a cloud. For the state detection 82, characteristic variables or state variables of the energy store 16, 32, 42, such as the internal resistance Ri, the temperature T of the energy store 16, 32, 42, the open-circuit voltage U0 and, optionally, further variables are ascertained using the measured variables U, I, T and, optionally, an underlying model or the like. Due to a measured ASIC temperature T (measured variable), the state detection 82 could, for example, ascertain the temperature T of the energy store 16, 32, 42 as the state variable T according to a particular algorithm. Particular state variables such as the internal resistance Ri, temperature T, open-circuit voltage U0 are passed to a static model 86. The parameters 78, as ascertained in FIG. 5, and/or the load profile 50, 52, in particular a current profile, are supplied to this static model 86. This static model 86 ascertains the (static) polarization voltage Upol via the ratio of the polarization resistance Rpol to the internal resistance Ri (Rpol/Ri). In order to ascertain the internal resistance Ri by means of the state detection 82, a small excitation of the on-board power system is required, optionally by deliberately connecting a load. A main feature of the approach is that the logic for predicting does not require any load profile, similar to the load profile 52 with maximum current level Ipeak or maximum duration tpeak.

The polarization voltage Upol at the energy store 16, 32, 42 can be ascertained via the following equation. For this purpose, the corresponding ratio Rpol/Ri, at the maximum load (Ipeak, tpeak), is ascertained from the assignment table 72 or the polynomial 76 depending on the temperature T ascertained by the sensor 34, 44 or the state detection 82, or depending on the open-circuit voltage U0 ascertained by the state detection 82. The maximum current Ipeak from the load profile 50, 52 respectively used as the basis in FIG. 4 is used as the current I. The internal resistance Ri and the open-circuit voltage U0 are provided by the state detection 82. The polarization voltage Upol can thus be ascertained using the following second equation:

$$Rpol = f(t_{peak}, I_{peak}, U0, T)$$

$$Ri = f(U0, T)$$

$$U_{pol} = \frac{Rpol}{Ri} \cdot Ri \cdot I_{peak}$$

The voltage drop across the internal resistance URi is calculated as $$U_{Ri}(T, U0) = Ri(U0, T) \cdot I_{peak},$$

wherein, in the state detection 82, Ri (U0, T) is determined from measured current and voltage values I, U and, optionally, filtered.

In the following block 90, the voltage Up arising at the energy store 16, 32, 42 is predicted. This prediction in block 90 takes place as a function of the (stationary) polarization voltage Upol, the open-circuit voltage U0 and the voltage drop URi across the internal resistance Ri according to the following equation:

$$U_p = U_0 - U_{Ri} - U_{pol}$$

If the predicted voltage Up falls below a voltage limit Ulimit, for example 9V, a warning or countermeasure is initiated (Up<Ulimit). In this case, the energy store 16, 32, 42 is considered to be no longer performant.

Thus, the model 86 uses as input data not only the current profile or load profile 50, 52 but also the ascertained parameters 78 of the respective energy store 16, 32, 42 (FIG. 6).

The function value is always adjusted in the sensor 34, 44 as a result of changed operating conditions, such as the temperature T of the energy store 16, 32, 42 or a changed state of charge SOC or open-circuit voltage U0. An adjustment of the voltage prediction Up via the aging is inherently safely designed as a result of the ratio of the polarization resistance Rpol to the internal resistance Ri so that an adjustment via the aging is not necessary, as explained below.

Very commonly occurring aging mechanisms in lead-acid batteries as a possible energy store 16, 32, 42 are corrosion (1) and the loss of active mass (2).

(1): Corrosion is primarily noticeable by an increase in the internal resistance Ri. Since the ratio of the polarization resistance to the internal resistance (Rpol/Ri) of unaged energy stores 16, 32, 42 or batteries is selected as the parameter set, it is assumed that, as a result of corrosion as the dominant aging mechanism, the ratio Rpol/Ri decreases due to corrosion, but at least does not to increase.

(2): The same applies to the loss of active mass (LAM). The loss of active mass reduces the responsive, active battery surface, whereby both resistance types, Rpol and Ri, should increase, but not the ratio Rpol/Ri. Only for very strongly LAM-aged batteries can an increase of Rpol/Ri occur; however, in this state, the battery has already aged to such an extent that it must be eliminated anyway.

The polarization resistance Rpol is finally determined via the currently applied, aged internal resistance Ri_g as a function of the ratio of the polarization resistance Rpol/Ri at the begin of life (BOL) of the energy store 16, 32, 42: (Rpol/Ri) BOL*Ri_g.

$$U_{pol} = \frac{Rpol}{Ri} \cdot Ri\_g \cdot I_{peak}$$

FIG. 7 shows the described relationships, which depend on the time t or aging. Thus, due to corrosion of the energy store 16, 32, 34, the internal resistance Ri at the end of life (EOL) increases disproportionately in comparison to the polarization resistance Rpol. If the ratio Rpol/Ri (Kor) due to corrosion is now considered, this ratio decreases more linearly. Due to the loss of active mass (LAM), in contrast to corrosion, the polarization resistance Rpol increases more toward the end of life EOL. Here too, due to the loss of active mass, the ratio Rpol/Ri (LAM) does not increase at the beginning. Only with very pronounced LAM does the ratio again reach the initial level at the begin of life of the energy store 16, 32, 42. From this point on, it can be assumed that the end of life (EOL) of the energy store 16, 32, 42 has been reached.

Figure 9:
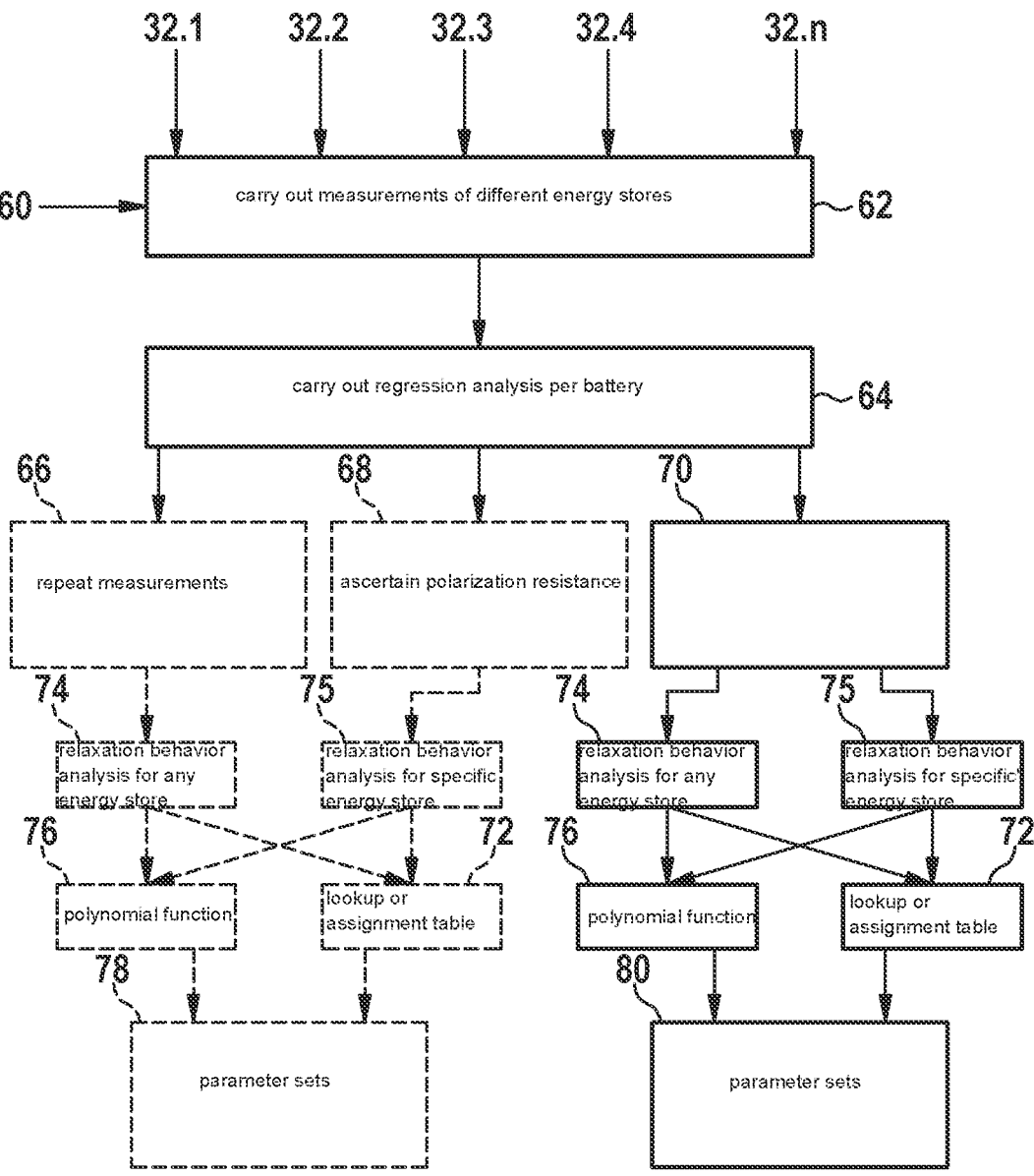
FIG. 9 shows a block diagram for ascertaining the parameters for a dynamic model, according to an example embodiment of the present invention.

The exemplary embodiment according to FIG. 9 is supplemented, in comparison to that of FIG. 5, with a procedure for creating parameters 80 for a dynamic model 88. The dynamic model 88 is described in more detail later in connection with FIG. 10.

An important feature of the present invention is the taking into account of the loading history of the energy store 16, 32, 42, in particular of the battery, for the voltage prediction Up. In driving operation, there are dynamic load situations that also mean different loads for the energy store 16, 32, 42 depending on the driving patterns. It is thus sufficient not only to consider a static operating point (in the so-called equilibrium state of the energy store 16, 32, 42) but, and in particular, to include the operating history in order to be able to safely and reliably form the voltage prediction Up in dynamic driving situations under a heavy load on the energy store 16, 32, 42 (discharging of the energy store 16, 32, 42). The present invention disclosed herein provides the possibility to extend an arbitrarily derived voltage prediction Up (constant estimated value or any load profile 50, 52 as described by way of example in connection with FIG. 5) for dynamic load cases. A voltage prediction Up can thus be carried out considerably more accurately. One feature of the present invention is the temporal weighting of the loads that occurred: If any load on the energy store 16, 32, 42 occurs, the prediction value Up (as ascertained by way of example in block 90 according to FIG. 6 in the static operating case) is adjusted. However, other prediction or estimation methods for the static portion of the predicted characteristic variable Up that do not draw on FIG. 6 can also be used.

The basis in this respect is the recording of measurement data of the energy store 16, 32, 42 using a generic measurement specification 60. By using these measurements, the influencing factors of the voltage behavior can be analyzed separately per energy store 16, 32, 42. The parameterization also includes the dynamic behavior of the energy stores 16, 32, 42. The dynamic resistance behavior of the energy stores 16, 32, 42, in particular of the batteries, is approximated and used in the form of analytical functions. If the prediction value is derived via a load profile 50, 52 as described in connection with FIGS. 2 and 3, the previous load on the battery as an additional input variable can make the dynamic algorithm even more accurate.

The current level I and the loading time t of the load profile 50 are used as input variables. A charge integration is carried out and reset in rest phases via a time-dependent decay behavior. A time-dependent decay function could be carried out via an e function or a pT1 element. An analytical function describes the relationship between the charge history Q and the additional overvoltage U. Both the build-up of the overvoltage U and the decay behavior were validated on the basis of measurement data (see generic measurement plan). As a result, the voltage prediction Up can always run safely even in highly dynamic processes. The algorithm thus weights the prediction value Up depending on the preload of the energy store 16, 32, 42, represented in the variable Udyn, τ, which represents an influence of a loading history of the energy store 16, 32, 42 on the characteristic variable Up.

The polarization resistance Rpol of an energy store 16, 32, 42 can be very different depending on the operating condition of the energy store 16, 32, 42. In principle, a part of the polarization resistance Rpol is always the charge transfer resistance, an overvoltage, which depends on the temperature T and on the state of charge SOC of an energy store 16, 32, 42. Additional portions of the polarization resistance Rpol can be mass transport limitations, such as diffusion processes in an energy store 16, 32, 42. Diffusion effects are substantially influenced by the state of the energy store 16, 32, 42. The function therefore describes the relationship between the loading history and the overvoltage as a function of the temperature T of the energy store 16, 32, 42 and the state of charge SOC.

Figure 10:
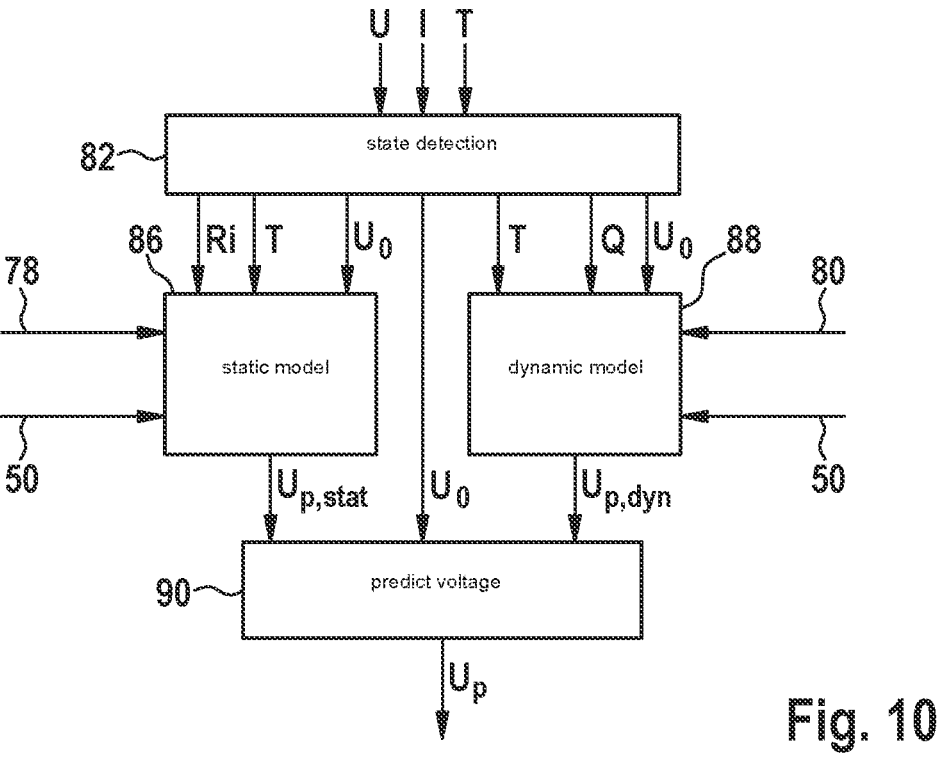
FIG. 10 a block diagram for ascertaining a predicted characteristic variable of the energy store on the basis of the static and dynamic model, according to an example embodiment of the present invention.
Figure 11:
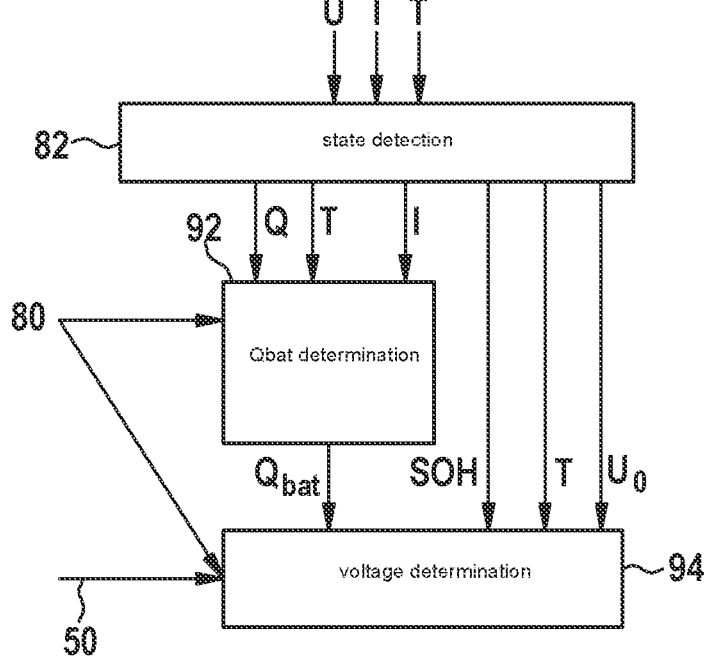
FIG. 11 shows a block diagram for ascertaining a predicted characteristic variable of the energy store on the basis of the dynamic model, according to an example embodiment of the present invention.

The voltage prediction Up is extended for dynamic load situations (FIG. 11). In the exemplary embodiment according to FIGS. 5 and 6, an algorithm is described by way of example, which can predict the polarization voltage Upol of energy stores 16, 32, 42 as a function of the operating point. The polarization voltages Upol are measured under defined ambient conditions (operating points from rest, the energy stores 16, 32, 42 are in the relaxed state). This is important in order to detect (FIG. 10) basic dependencies, taking into account the operating conditions (current level of the pulse Ipeak, battery temperature T, time duration tpeak of the current pulse Ipeak, state of charge SOC of the energy store 16, 32, 42, or open-circuit voltage U0).

Figure 8:
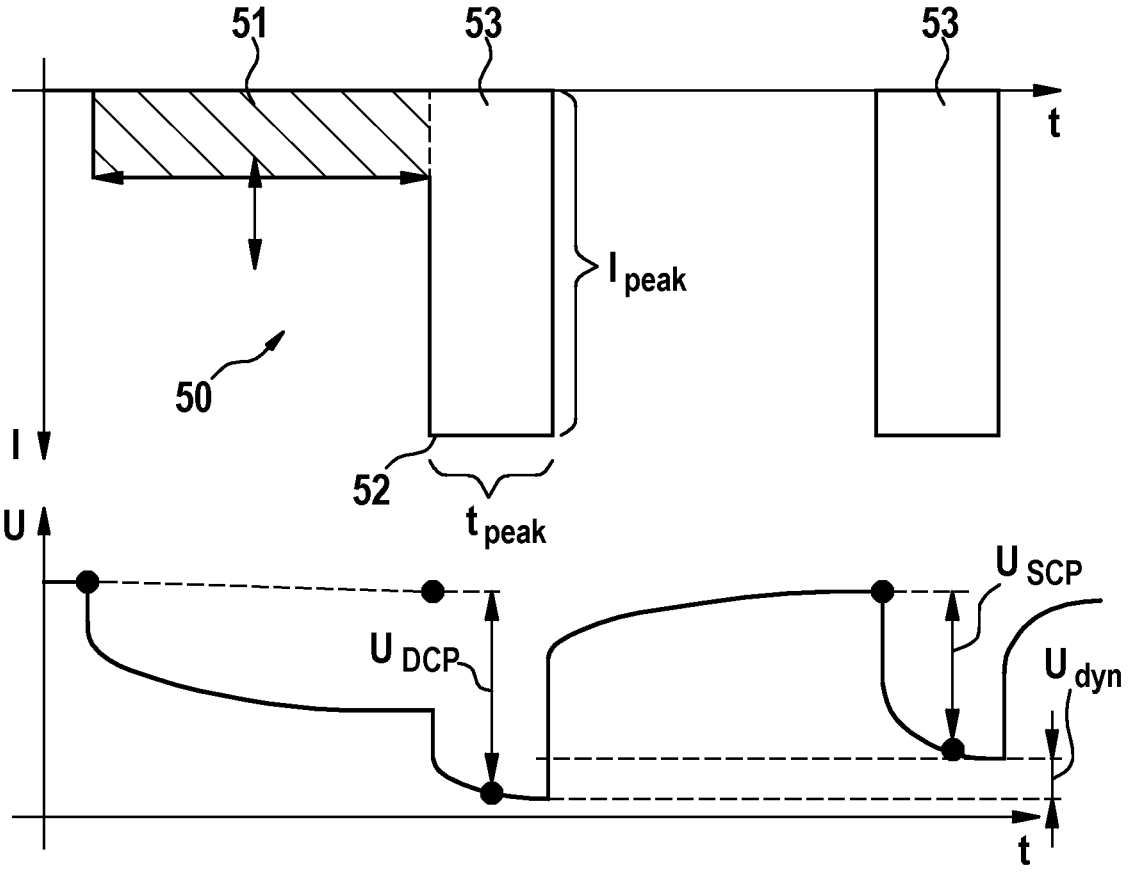
FIG. 8 shows load profiles for determining dynamic parameters for predicting a dynamic characteristic variable of the energy store, according to an example embodiment of the present invention.

For different types of energy stores 32.1, 32.2, 32.3, 32.4, . . . 32.n, for different load profiles 52, for example first a load profile with base load 51 and peak load 53 (FIG. 3A), subsequently a further load profile without base load and only with peak load 53 (FIG. 3C), associated voltage profiles U are ascertained as shown in FIG. 8. It is important that a rest phase or relaxation phase is between the two loadings. The increase in the voltage U in the rest phase takes place with a relaxation time constant or decay behavior τ, which is temperature-dependent τ (T). The method can be applied to individual battery types or to battery groups. This rest phase is to be selected to be at least so long that the energy store 16, 32, 42 recovers again in the meantime or the open-circuit voltage U0 arises again. The first load profile 52 (like the further load profile 52) is also applied when the energy store 16, 32, 42 is in a defined state, in particular when the open-circuit voltage U0 is applied. The variable Udyn, τ, which has been stored as a function of at least one state variable U0, T, SOC, Q, Ri and represents an influence of a loading history of the energy store 16, 32, 42 on the characteristic variable Up, is ascertained in this way.

The peak load 53, as used by way of example in the load profile 52 or the further load profile 52, is in this case defined by the maximum load, such as the maximum current Ipeak, which is applied for a duration tpeak. The base load 51 is generally characterized by a longer load curve with lower maximum load. With the application of the base load 51, the voltage U decreases and drops even further with the application of the peak load 53. The variable of interest is the total voltage drop UDCP resulting therefrom. After completion of the loading of the energy store 16, 32, 42 with the peak load 53, the voltage U increases again after a certain rest period. Subsequently, the energy store 16, 32, 42 is only loaded with the peak load 53, without prior loading with the base load 51. The voltage U now decreases to a lower value USCP. The actual voltage behavior Udyn or the actually measured value of the dynamic voltage Udyn is calculated using the following equation:

$$Udyn(Q, U0, T) = UDCP - USCP$$

wherein it can be approximated via a term that is exponentially dependent on the temperature and linearly dependent on the charge. The dynamic voltage Udyn depends on the charge Q (charging Q as an integral over the current curve I or the load 52, including the temperature-dependent decay behavior), the state of charge SOC or open-circuit voltage U0, and the temperature T of the energy store 16, 32, 42. The dynamic voltage Udyn can represent a measure of the loading history of the energy store 16, 32, 42 as a variable Udyn, τ which represents an influence of a loading history of the energy store 16, 32, 42 on the characteristic variable Up.

The measurements of the voltage curves are repeated at varying ambient parameters such as the temperature T, preload Q (charge Q as an integral over the current curve I) and the state of charge SOC or open-circuit voltage U0. This takes place in block 62 according to FIG. 9.

In the following block 64, the regression for each energy store 16, 32, 42 takes place on the basis of the measured values for different state variables Q, SOC, T. For the dynamic voltage Udyn ascertained above, the coefficients for the following typical equation can be determined as a function of the state variables Q, U0 or SOC, T:

$$Udyn(Q, U0, T) = a(U0) * \exp\big(b(U0/T) * Q + c(U0)\big)$$

wherein a, c, d are constant parameters to be determined depending on the measured values, wherein a, b, c are variables dependent on the resting state U0 (or state of charge SOC).

The relaxation behavior specifies how the voltage U regresses again after the end of the full load 53 but with prior loading with the base load 51. This can, for example, be modeled via a new state variable Qbat, as shown in FIG. 11. It represents the current integration Q in discharging phases but allows the charge value Q in rest phases to be represented via a time-dependent decay behavior. The time-dependent decay behavior τ is temperature-dependent τ(T):

$$Qbat = f(I, Q, \tau(T))$$

wherein Qbat represents the state variable of the charge Q for the load effectively applied to the battery.

The relaxation behavior can be analyzed on the basis of battery measurements, as shown in FIG. 8, for example. The relaxation time τ can, for example, be stored in an assignment table as a function of the temperature T, τ(T). The lower the temperature T, the greater the relaxation time τ. This can take place for either a specific (block 75) or any (block 74) energy store 16, 32, 42 that has been measured offline.

Alternatively, the ascertained combinations of measured values (Udyn(Q,SOC,T)) for the subsequent online ascertainment of the predicted voltage Up (according to FIG. 11 described below) could also be stored without regression, for the respective types of energy stores 16, 32, 42.

Instead of the generalization 74, the parameters 80 can also be ascertained within the framework of a solution specific to the respective energy store 16, 32, 42, block 75. The described steps preferably take place offline again, i.e., are carried out prior to starting the method.

After the parameters have been generalized in block 74, the parameters 80 for a dynamic model 88 according to FIG. 11 are determined. In this model, a distinction is made between the determination of the state variable Qbat and the voltage determination 94 (voltage determination Upol, dyn (predicted dynamic polarization voltage). The state variable Qbat uses the current charge curve Q (current integration), battery temperature T and the current value I as input data. In block 92 (Qbat determination), the charge Q is reset in the currentless state via a time delay element. This Qbat is used in the later prediction Upol, dyn via the previously established equation.

The embodiment according to FIGS. 10 and 11 is carried out in ongoing operation of the motor vehicle. This takes place using a dynamic model 88, which represents the loading history of the energy store 16, 32, 42, in particular using the parameters 80 ascertained in FIG. 9. Again, the sensor 34, 44 ascertains corresponding measurement data, such as the voltage U, current I, temperature T of the energy store 16, 32, 42 and provides them to the state detection 82 of the energy store 16, 32, 42. Therefrom, the state detection 82 ascertains particular state variables of the energy store 16, 32, 42 that are also provided to the dynamic model 88, such as the temperature T of the energy store 16, 32, 42 and/or the charge Q or Qbat of the energy store 16, 32, 42 and/or the internal resistance Ri and/or the state of charge SOC and/or the open-circuit voltage U0 of the energy store 16, 32, 42. In addition, the dynamic model 88 obtains the parameters 80 ascertained in FIG. 9. Optionally, the load profile 50, 52 is provided to the dynamic model 88. The dynamic model 88 predicts the arising dynamic voltage Upol, dyn as a measure of the loading history.

In FIG. 10, the total polarization voltage Upol is now determined by way of example from the sum of the static polarization voltage Upol, stat (or Up, stat according to FIG. 10) and the dynamic polarization voltage Upol, dyn (or Up, dyn according to FIG. 10):

$$Upol = Upol, stat + Upol, dyn$$

$$Upol, dyn = a(U0) * \exp\big(b(U0)/T\big) * Qbat + c(U0)$$

The predicted characteristic variable Up results from the following equation $$Up = U0 - Upol - URi$$

where U0 is the open-circuit voltage, Upol is the polarization voltage and URi is the voltage drop across the internal resistance.

If the predicted voltage Up falls below a critical limit value Ulimit (Up<Ulimit), this indicates a no longer intact energy store 16, 32, 42, and corresponding countermeasures or warnings are initiated.

Again, it should be mentioned that, optionally, the stationary variables, such as Upol, stat, can also be ascertained in a different manner than described in connection with FIGS. 5 and 6 or that the dynamic variable Upol, dyn alone already allows a statement about the quality of the energy store 16, 32, 42 to be made.

If the actual functional capability of the energy store 16, 32, 42 is not achieved, countermeasures are initiated. For example, a warning takes place and/or safety-related functions are blocked. The warning can be indicated to the vehicle operator in a display or other indication means. Alternatively, a corresponding warning could also be indicated via suitable communication channels, for example to the repair shop, a fleet operator, etc. The manual or automatic transition of the vehicle to a safe state could also be initiated, for example the stopping on the roadside, driving toward the next parking space, or the like (so-called safe stop of the vehicle).

The described method is in particular suitable for monitoring energy stores 16, 32, 42 for safety-relevant applications, for example for supplying safety-relevant consumers in a motor vehicle, in particular during autonomous driving. However, the use is not limited thereto.

The invention claimed is:

1. A method for monitoring an energy store in a motor vehicle, wherein the energy store supplies at least one safety-relevant consumer, the method comprising the following steps:

predicting at least one characteristic variable of the energy store;

recording at least one measured variable of the energy store;

ascertaining at least one state variable of the energy store as a function of at least the measured variable;

wherein the characteristic variable is predicted using a variable that has been stored in advance as a function of at least one of the state variables that represents an influence of a loading history of the energy store on the characteristic variable, wherein the variable is selected as a function of the one of the state variables.

2. The method according to claim 1, wherein the energy store is loaded with a load profile including at least one base load and one peak load, and, after a rest phase, until an open-circuit voltage of the energy store has been reached, the energy store is loaded with a further load profile including a peak load, and wherein an arising voltage curve is evaluated to ascertain the variable.

3. The method according to claim 2, wherein the arising voltage curve is evaluated to ascertain a time constant with which voltage of the energy store increases again in the rest phase, and/or to ascertain a voltage level to which the voltage increases again at a start of the loading with the further load profile, and/or to ascertain a dynamic voltage including a voltage difference of a voltage drop during the loading with the load profile including the peak load and previous base load, and a voltage drop during a subsequent loading with only with the peak load.

4. The method according to claim 2, wherein the voltage curve and/or the variable which includes a dynamic voltage, is ascertained again as a function of at least one of the state variables in the case of a changed state variable.

5. The method according to claim 1, wherein the variable, which includes a dynamic voltage (Udyn), is specified by an equation as a function of at least one of the state variables of the energy store by the following equation: Udyn (Q. U0, T)=a*exp(b(U0)/T)*Q+c, wherein a, c, d are constant parameters to be determined depending on measured values, and T represents a temperature, Q represents a charge, and b represents a variable dependent on a state of charge or the open-circuit voltage (UO).

6. The method according to claim 1, wherein a time constant including a relaxation time, which represents a relaxation behavior of the energy store is used as the variable which represents an influence of a loading history of the energy store on the characteristic variable.

7. The method according to claim 6, wherein the time constant is ascertained as a function of a temperature of the energy store and/or is stored in an assignment table.

8. The method according to claim 6, wherein a state detection of the energy store ascertains, as a function of at least the measured variable, at least the state variable of the energy store, the state variable including an internal resistance of the energy store and/or a state of charge of the energy store and/or an open-circuit voltage of the energy store and/or a temperature of the energy store and/or a charge dependent on the time constant of the energy store.

9. The method according to claim 8, wherein: a sensor is provided which: (i) senses the measured variables and/or (ii) includes the state detection and/or (iii) is configured to store the variable.

10. The method according to claim 6, wherein the relaxation behavior of the energy store is represented by a state variable in the form of a charge, wherein the time constant is used to ascertain the state variable.

11. The method according to claim 6, wherein the relaxation behavior of the energy store is represented, via an expected voltage curve, how much the voltage curve increases in the rest phase.

12. The method according to claim 1, wherein the predicted characteristic variable depends on an open-circuit voltage of the energy store and/or on a dynamic voltage of the energy store and/or on a voltage drop across an internal resistance.

13. The method according to claim 1, wherein the characteristic variable is predicted as a function of a ratio of an internal resistance and a polarization resistance of the energy store, wherein, as a function of at least one current state variable of the energy store and/or of at least one current measured variable of the energy store, an associated ratio of the polarization resistance to the internal resistance is selected and is used for the prediction of the characteristic variable.

14. The method according to claim 1, wherein the predicted characteristic value is ascertained as a function of a polarization voltage and/or of a ratio, stored in advance, of a polarization resistance to an internal resistance, multiplied by a currently ascertained internal resistance and multiplied by a characteristic variable describing a peak load of the load profile including a peak current.

15. The method according to claim 1, wherein, when the predicted characteristic variable reaches a limit value, a measure is initiated including a blocking of a function that is safety-relevant and/or outputting a warning.

* * * * *